(12) United States Patent
Hu et al.

(10) Patent No.: US 7,593,278 B2
(45) Date of Patent: Sep. 22, 2009

(54) MEMORY ELEMENT WITH THERMOELECTRIC PULSE

(75) Inventors: Yufeng Hu, Pittsburgh, PA (US); Michael Seigler, Pittsburgh, PA (US); Kalman Pelhos, Pittsburgh, PA (US)

(73) Assignee: Seagate Technology LLC, Scotts Valley, CA (US)

(*) Notice: Subject to any disclaimer, the term of this patent is extended or adjusted under 35 U.S.C. 154(b) by 111 days.

(21) Appl. No.: 11/842,633

(22) Filed: Aug. 21, 2007

(65) Prior Publication Data
US 2009/0052222 A1    Feb. 26, 2009

(51) Int. Cl.
*G11C 7/04* (2006.01)

(52) U.S. Cl. .................. 365/211; 365/158; 365/163; 365/171; 365/173; 365/200

(58) Field of Classification Search .......... 365/158, 365/163
See application file for complete search history.

(56) References Cited

U.S. PATENT DOCUMENTS

| | | | |
|---|---|---|---|
| 4,685,081 A * | 8/1987 | Richman ................. 365/1 |
| 6,230,497 B1 * | 5/2001 | Morris et al. ............. 62/3.7 |
| 6,587,370 B2 * | 7/2003 | Hirai ..................... 365/171 |
| 6,819,531 B2 | 11/2004 | Shiroishi ................ 360/317 |
| 6,967,865 B2 * | 11/2005 | Lee ....................... 365/163 |
| 2004/0233584 A1 | 11/2004 | Liu et al. ................ 360/313 |
| 2005/0104104 A1 | 5/2005 | Schultz et al. ........... 257/295 |
| 2005/0111142 A1 | 5/2005 | Oshima .................. 360/313 |
| 2005/0185456 A1 * | 8/2005 | Nickel et al. ............ 365/171 |
| 2005/0231855 A1 | 10/2005 | Tran ..................... 360/324.1 |
| 2006/0249724 A1 * | 11/2006 | Krusin-Elbaum et al. ..... 257/2 |
| 2006/0281258 A1 | 12/2006 | Dieny et al. ............. 438/264 |
| 2007/0253243 A1 * | 11/2007 | Fontana et al. ........... 365/171 |

* cited by examiner

*Primary Examiner*—VanThu Nguyen
*Assistant Examiner*—R Lance Reidlinger
(74) *Attorney, Agent, or Firm*—David C. Bohn; Westman, Champlin & Kelly, P.A.

(57) ABSTRACT

A memory element comprises an addressable memory cell. A thermoelectric device couples to the memory cell. Electrical conductors provide a current pulse to the thermoelectric device. The current pulse generates a thermoelectric heat flow pulse between the thermoelectric device and the memory cell.

24 Claims, 11 Drawing Sheets

MEMORY ELEMENT WITH THERMOELECTRIC PULSE

FIELD

The present invention relates generally to memory arrays, and more particularly but not by limitation to non-volatile memory arrays.

BACKGROUND

Static RAM (random access memory) provides non-volatile storage and retrieval of data. Many different technologies are available for static RAM arrays that provide different design tradeoffs in terms of cost, manufacturing yield, cell size, array size, power consumption, read speed, write speed, bit error rate, maximum storage time and immunity from accidental erasure due to stray magnetic fields, radiation and other accidental erasure processes. There is a desire to provide a non-volatile data storage technology that provides improvement in one or more of these design areas.

Aspects of the present invention provide solutions to these and other problems, and offer other advantages over the prior art.

SUMMARY

Disclosed is a memory element. The memory element comprises an addressable memory cell.

The memory element comprises a thermoelectric device. The thermoelectric device thermally couples to the memory cell.

The memory element comprises electrical conductors. The electrical conductors provide a current pulse to the thermoelectric device. The current pulse generates a thermoelectric heat flow pulse between the thermoelectric device and the memory cell.

According to one aspect, multiple memory elements are arranged in an array and a grid of electrical conductors selectively addresses a selected memory element. According to another aspect, the current pulse has a pulse width in the range of 10 nanoseconds to 100 microseconds.

Other aspects will be apparent upon reading the following detailed description and review of the associated drawings.

DETAILED DESCRIPTION

In the aspects described below, a memory element includes a memory cell that is addressed for reading and writing. The memory element includes a thermoelectric device coupled to the memory cell. Electrical conductors provide a current pulse to the thermoelectric device. The current pulse generates a thermoelectric heat flow pulse between the thermoelectric device and the memory cell. The memory cell includes a layer that has a material property that is temperature sensitive. The material property is thermally varied by application of the thermoelectric heat flow pulse so that the material property has different values during read and write time intervals. In one example, the layer with the temperature sensitive heat property can be pulse heated during a write interval so that writing takes less energy, and pulse cooled during a read interval so that there is less chance of accidental writing during reading. The material in the layer that has a material property that is heat sensitive can take on many forms such as a magnetoresistive sensor, a magnetic tunneling junction, phase change material, rare earth transition metal alloy or other materials that can be used to store data and that have temperature sensitive material properties.

Figure 1A:
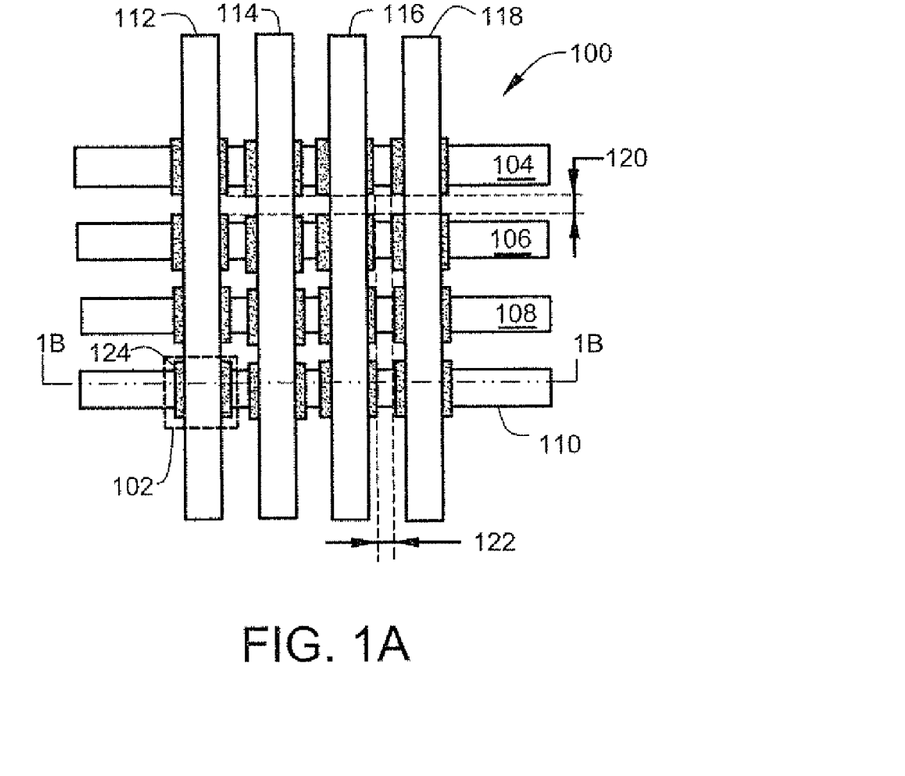
FIGS. 1A, 1B illustrate aspects of a memory array.
Figure 1B:
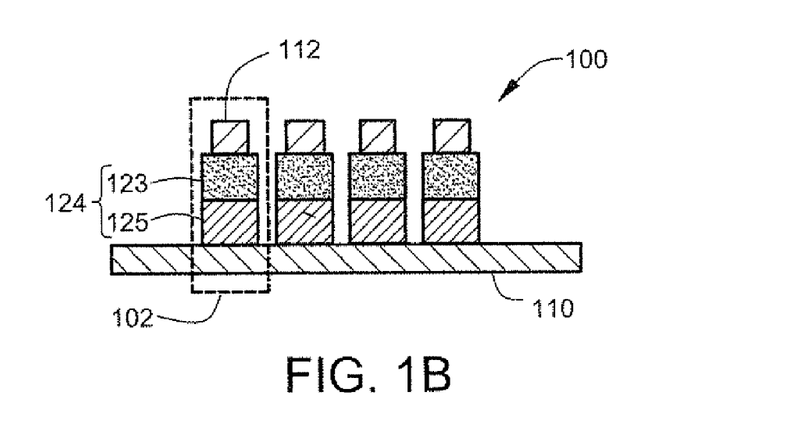

FIGS. 1A, 1B illustrate aspects of a memory array 100. The memory array 100 comprises an array of memory elements such as representative memory element 124. FIG. 1A illustrates a top view of the memory array 100. FIG. 1B illustrates a front cross-sectional view (along section line 1B-1B in FIG. 1A) of the memory array 100.

Each memory element 124 comprises a memory cell 123 and a thermoelectric device 125. Each memory cell, such as representative memory cell 123, is thermally coupled to a thermoelectric device, such as representative thermoelectric device 125. Each memory element, such as representative memory element 124, is at a location 102 in the array where it is selectively addressable for reading and writing. The memory cell 123 stores a bit of data. The thermoelectric device 125 provides a pulse of heating, a pulse of cooling, or both sequentially in order to change a material characteristic in the memory cell 123. The memory cell 123 includes a layer with a material property that is temperature sensitive. The material property takes on a first value at a first temperature during a write interval, and takes on a second value at a second temperature during a read interval. Timing of thermal heating and cooling pulses is described below in more detail in connection with FIG. 1C.

It is understood that the array of the memory elements 100, while illustrated with 4 rows, 4 columns and 16 memory elements, typically includes a much larger number of rows, columns and memory elements. It is understood that the memory element at location 102 is representative of all of the memory elements in the memory array 100. Descriptions of features at the location 102 also apply to other memory elements in the array of memory cells 100.

In FIG. 1A, conductors 104, 106, 108, 110 are arranged in rows on one side of the array 100. Conductors 112, 114, 116, 118 are arranged in columns on a second opposite side of the array 100. The array 100 comprises a rectangular array of memory elements in rows and columns. The memory elements in the memory array 100 are separated from one another by row spaces and column spaces (such as a row space 120 and a column space 122). In one aspect, row spaces and column spaces are filled with electrical insulation material (not illustrated) such as alumina. The row spaces and column spaces are sufficiently wide to provide adequate electrical, thermal and magnetic isolation between the memory elements in the array 100.

The memory element 124 at location 102 can be addressed for reading and writing through the conductors 110, 112 that cross at the location 102. The location 102 is selected (addressed) for read or write access by the use of solid state switches (not illustrated in FIGS. 1A-1B) to select the row and column conductors 110, 112 that cross in the cell 102. When the memory element 124 is accessed, an electrical potential is applied to the memory element 124 between the conductors 110, 112.

In one aspect, the memory element 124 includes electrical current routing circuitry so that currents (as well as voltages) applied from the conductors 110, 112 can be shared by both the memory cell 123 and the thermoelectric device 125. Current routing circuitry is described in more detail below in connection with FIGS. 4A-4C.

While the array 100 is illustrated with a single set of row conductors and a single set of column conductors, it will be understood that additional sets of row and column conductors can be provided for addressing a location in an array of memory devices. Two, three, four or more sets of conductors can be used for addressing. An exemplary array with four sets of conductors is described below in connection with FIG. 2.

Figure 1C:
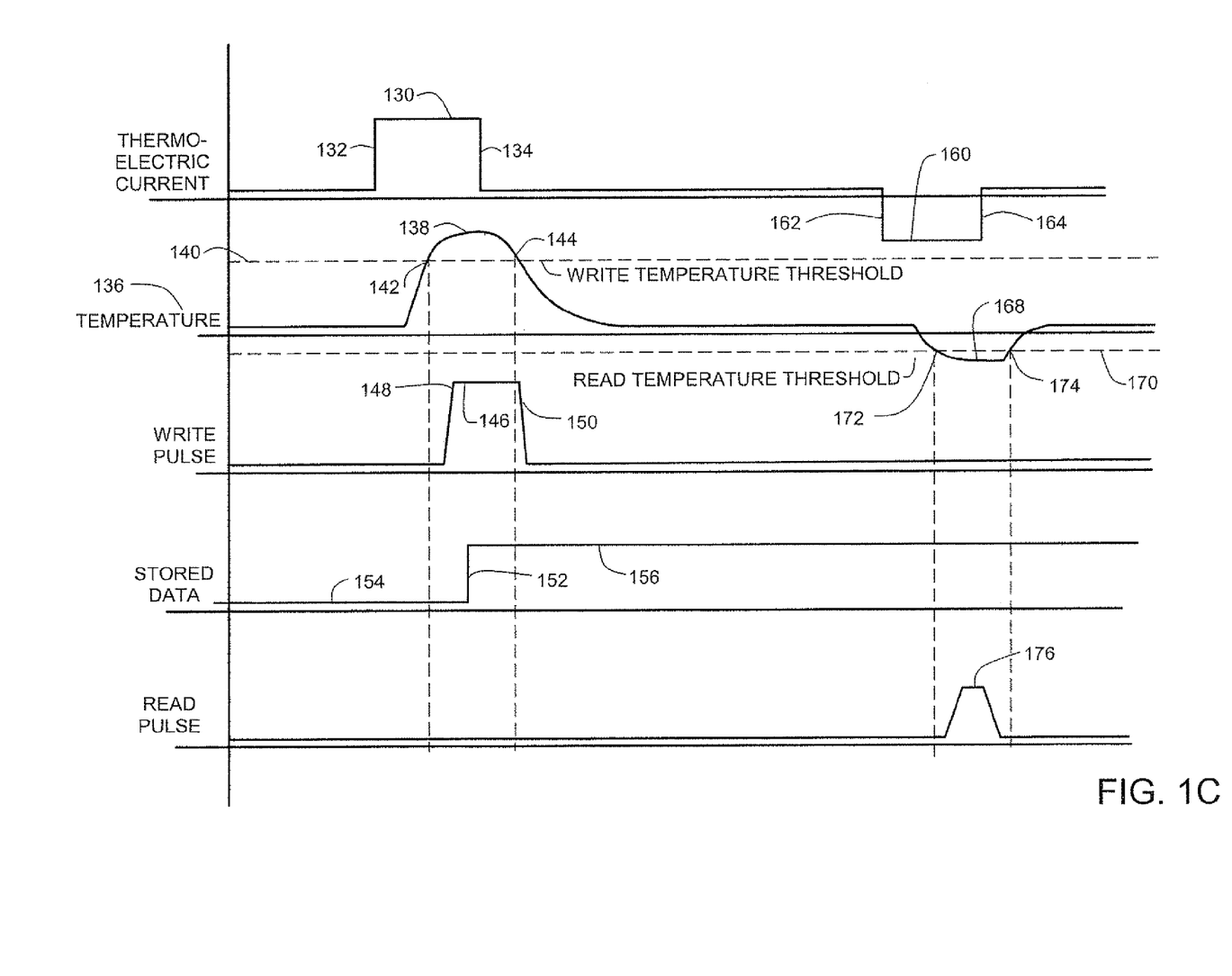
FIG. 1C illustrates aspects of a timing diagram for reading and writing data to a memory element.

FIG. 1C illustrates an exemplary timing diagram for reading and writing data to a memory element (such as memory element 124). In FIG. 1C, horizontal axes represent time and vertical axes represent various signals.

A positive polarity thermoelectric current pulse 130 is provided from time 132 to time 134. The current pulse 130 flows through a thermoelectric device (such as thermoelectric device 125), and the thermoelectric device provides a pulse of heating to a selected region of a memory cell (such as memory cell 123). The selected region of the memory cell has a temperature 136. The pulse of heating causes a temperature rise pulse 138. The temperature rise pulse 138 rises above a write temperature threshold 140 from time 142 to time 144. During the time interval from time 142 to time 144 (the volatile time interval), the coercivity (or other material property of the selected region) is reduced, such that the data bit stored in the selected region is temporarily volatile and can be changed by application of an external field.

During the time interval from time 142 to time 144, a write pulse 146 is applied. The write pulse 146 starts during the time interval (from time 142 to time 144) when the data bit is volatile and can be written. The write pulse applies an external field to the selected region. The write pulse 146 ends at time 150. The time 150 can be during the volatile time interval or after the volatile time interval. During the write pulse, the stored data changes at time 152 from a "zero" level 154 to a "one" level 156.

A negative polarity thermoelectric current pulse 160 is provided from time 162 to time 164. The current pulse 160 flows through a thermoelectric device (such as thermoelectric device 125), and the thermoelectric device provides a pulse of cooling to a selected region of a memory cell (such as memory cell 123). The pulse of cooling causes a temperature drop pulse 168. The temperature drop pulse 168 drops below a read temperature threshold 170 from time 172 to time 174. During the time interval from time 172 to time 174 (the nonvolatile time interval), the coercivity (or other material property of the selected region) is increased, such that the data bit stored in the selected region has temporarily increased nonvolatility and cannot be accidentally changed by application of a read pulse. A read pulse 176 is applied to read the data bit during the non-volatile time interval.

As illustrated in FIG. 1C, the use of thermal pulses from a thermoelectric device can be used to increase volatility during writing of data, or can be used to decrease volatility during reading of data, or both. The heating and cooling pulses are applied to a nanostructure scale or microstructure scale device and have pulse widths in the range of about 10 nanoseconds to 100 microseconds. The timing diagram illustrated in FIG. 1C is merely exemplary of the general processes involved. It will be understood that various other timing patterns can also be used.

Only small amounts of power are consumed by the thermoelectric pulse because it is of short duration. The duty cycle of writing to an array is low, and hence the average power consumed by an array for thermoelectric pulses in writing is low. If thermoelectric pulses are used for reading, average power consumption for thermoelectric pulses is also low. In one aspect, the cooling of the selected region reduces the amount of power that is needed for the write pulse itself, further lowering power consumption for the array.

Figure 2:
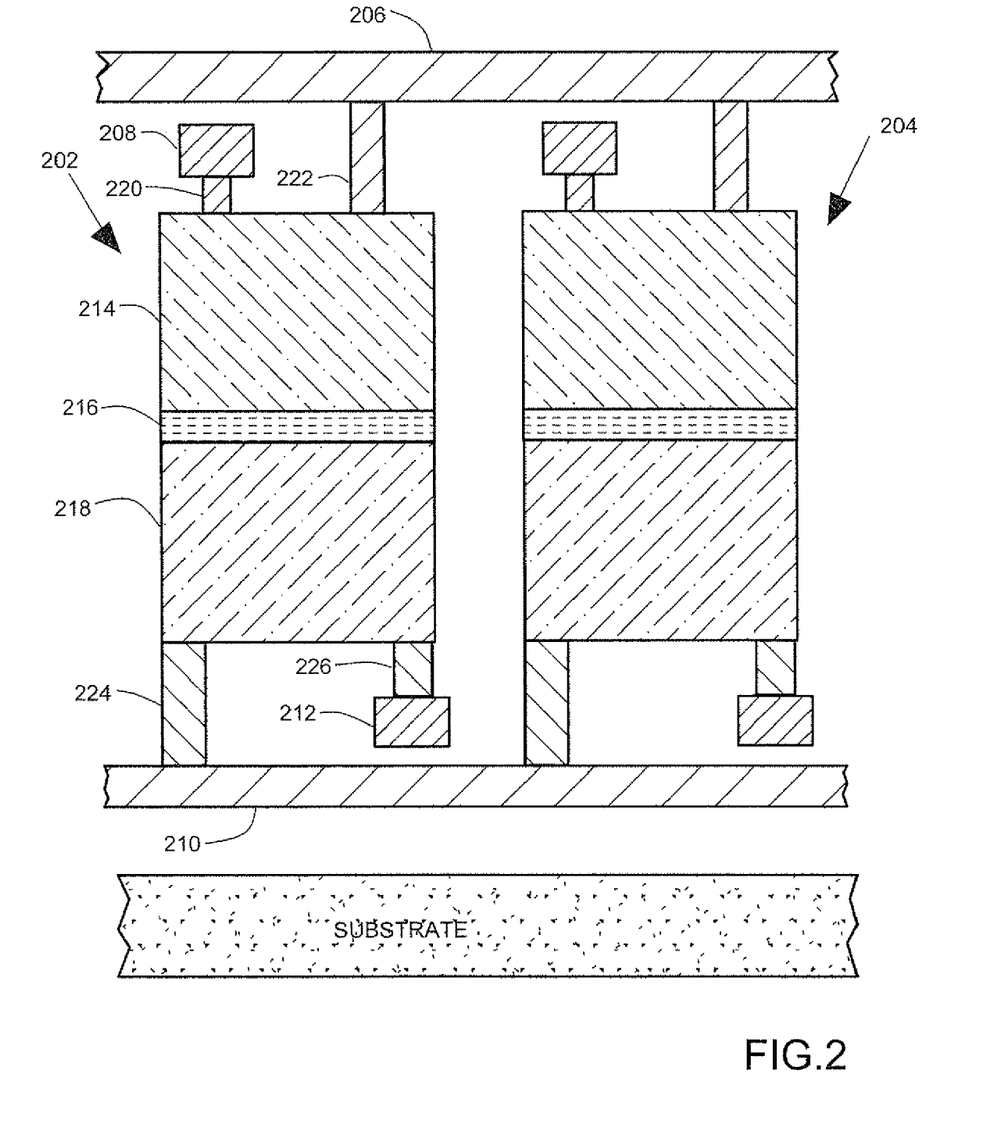
FIG. 2 illustrates electrical connections to memory elements in an array that includes four sets of addressing conductors (busses).

FIG. 2 illustrates electrical connections to memory elements 202, 204 in an array that includes four sets of addressing conductors (also called busses) 206, 208, 210, 212. Exemplary memory element 202 comprises a memory cell 214, an electrical insulation layer 216 and a thermoelectric device 218. The electrical insulation layer 216 is formed of a material that provides electrical insulation between memory cell 214 and thermoelectric device 218. The material of electrical insulation layer 216 is thermally conductive to promote heat flow between the thermoelectric device 218 and the memory cell 214. The thickness of the electrical insulation layer is minimized to reduce thermal resistance between the memory cell 214 and the thermoelectric device 218. In one aspect, the electrical insulation layer is formed of material such as aluminum oxide, aluminum nitride, silicon dioxide or silicon nitride.

A via 220 electrically connect the memory cell 214 to the bus 208. A via 222 electrically connects the memory cell 214 to the bus 206. A via 224 electrically connects the thermoelectric device 218 to the bus 210. A via 226 electrically connects the thermoelectric device 218 to the bus 210.

Figure 3:
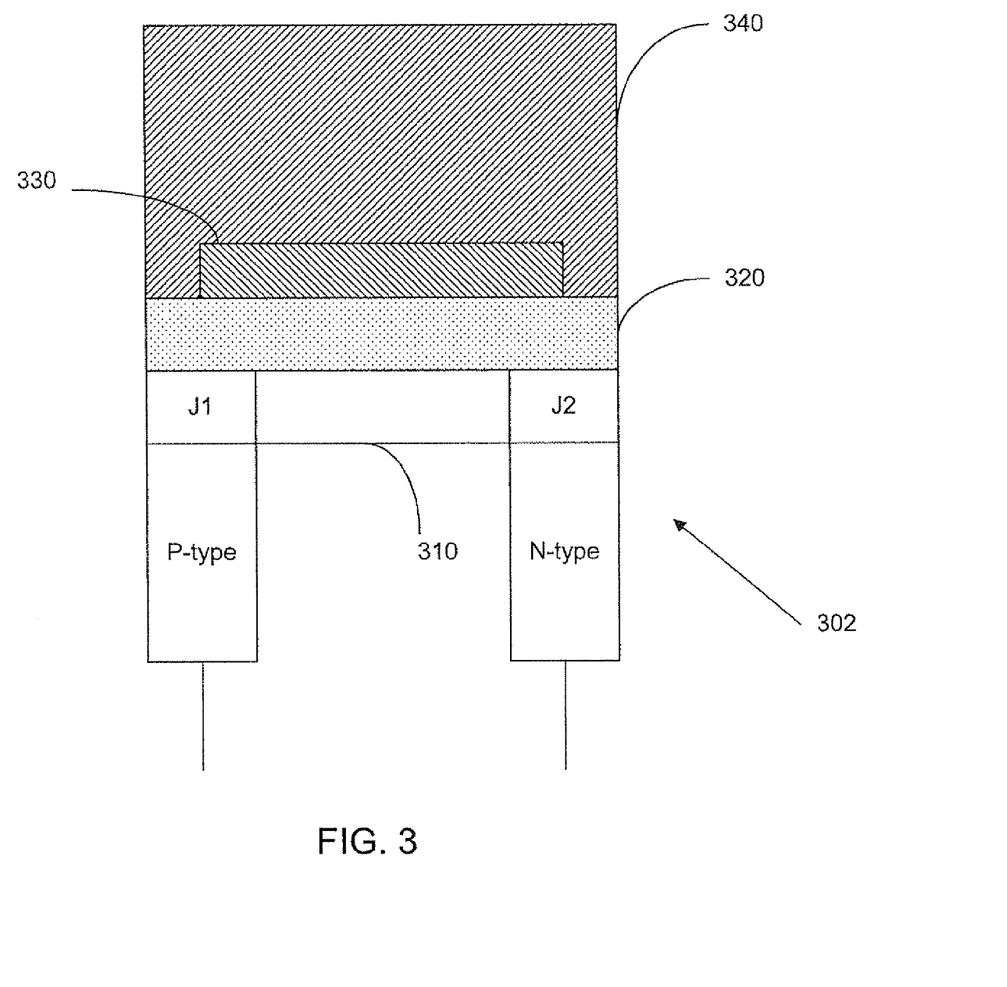
FIG. 3 illustrates aspects of arranging heat flow to and from a thermoelectric device in a memory element.

FIG. 3 illustrates an exemplary arrangement of heat flow to and from a thermoelectric device 302 in a memory element. The thermoelectric device 302 is illustrated as a pair of thermoelectric junctions J1, J2. The thermoelectric junctions J1, J2 are formed by electrically joining a P-type and an N-type thermoelectric elements in series to an electrical conductor 310. An external circuit provides current pulses that pass through the thermoelectric junctions. When the current pulse passes through the junctions in a first direction (first polarity), junctions J1 and J2 function as hot junctions, and the thermoelectric device 302 produces heat flow into the memory cell 340. When the current pulse passes through the junctions in a second direction (second polarity), junctions J1 and J2 function as cold junctions, and device 302 absorbs heat from memory cell 340.

Another example of thermoelectric device 302 may include only a single type of thermoelectric element to form thermoelectric junction J1. In this case, conductor 310 may prohibit device 302 from absorbing heat from memory cell 340, which will result in a discharge of heat from the system. Consequently, the efficiency of device 302 may be substantially lower than observed in the previous embodiment when two dissimilar types of thermoelectric elements were implemented and device 302 absorbed heat from memory cell 340.

The thermoelectric device 302 in FIG. 3 is closely thermally coupled through an electrically insulating, thermally conducting layer 320 to a selected region 330 of a memory cell. During a thermoelectric current pulse, heat is conducted between the device 302 and the selected region 330. The selected region is either heated or cooled, depending on polarity of the thermoelectric current pulse. The selected region 330 comprises material that has a material property that changes with temperature. Device 302 can heat during a write interval to alter the material property so that it is easier to write data. Alternatively or additionally, device 302 can cool during a read interval to alter the material property so that it is more difficult to write during the read interval.

Known thermoelectric properties such as the Peltier effect, the Thompson emf, the Seebeck effect, the thermocouple law of homogeneous circuits, law of intermediate metals, and the law of intermediate temperatures can be used to obtain a combination of electrical and thermal characteristics that is desired for a particular thermal pulse application in a memory array. In one aspect, semiconductor thermoelectric devices are used to provide high efficiency.

Figure 4A:
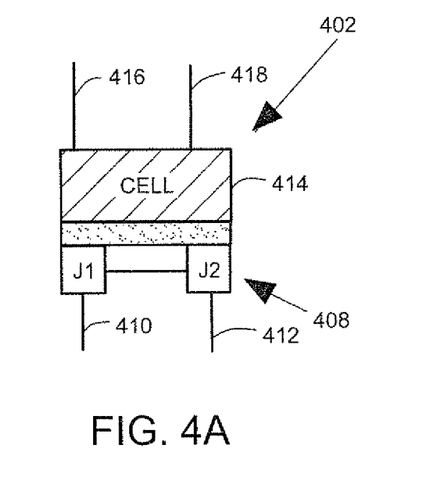
FIGS. 4A-4C illustrate various aspects of busses and current routing circuitry in alternative memory elements.
Figure 4B:
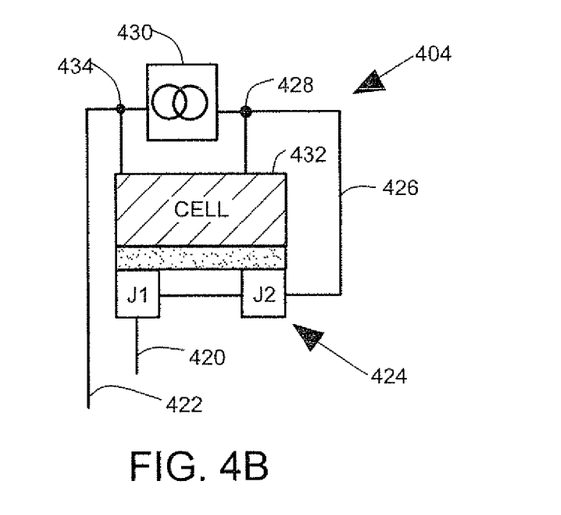
Figure 4C:
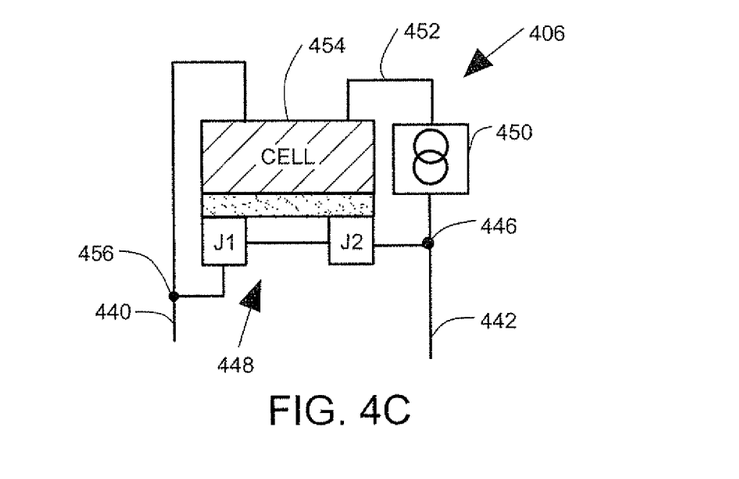

FIGS. 4A-4C illustrate various aspects of busses and current routing circuitry in alternative memory elements 402, 404, 406. FIG. 4A illustrates the memory element 402 connected to a 4 bus structure. The thermoelectric device 408 is connected to busses 410, 412. The memory cell 414 is connected to busses 416, 418.

FIG. 4B illustrates the memory element 404 connected to two busses 420, 422. Current flows from bus 420 through the thermoelectric device 424 and through conductor 426 to a node 428. At node 428, a portion of the current flows to a controlled current source (current limiter circuit) 430, and a portion of the current flows to a memory cell 432. The current from the cell 432 and the current from the controlled current source 430 flow to node 434. The current from node 434 flows to the bus 422. The current limiter circuit 430 can have two different current limits depending on the two different polarities of currents that can flow from the busses 420, 422. The bus current is shared by passing through the thermoelectric device 424 and the memory cell 432 in series. Only two current busses 420, 422 are needed to provide current for both the thermoelectric device 424 and the memory cell 432.

FIG. 4C illustrates the memory element 406 connected to two busses 440, 442. Current flows from bus 442 to a node 446. From the node 446, a portion of the current flows through a thermoelectric device 448 and a portion of the current flows through current limiter 450, conductor 452 and memory cell 454. Current from the memory cell 454 and the thermoelectric device 448 flow to a node 456. Current flows from the node 456 back to the bus 440. The current limiter circuit 450 can have two different current limits depending on the two different polarities of currents that can flow from the busses 440, 442. The bus current is shared by passing portions through the thermoelectric device 424 and the memory cell 432 in parallel. Only two current busses 440, 442 are needed to provide current for both the thermoelectric device 424 and the memory cell 432.

The bus and current sharing arrangements illustrated in FIGS. 4A, 4B, 4C are exemplary, and other circuit arrangements can be used as well. While current limiters have been illustrated in connection with FIGS. 4B and 4C, it is understood that arrangements of voltage limiters can be used alternatively or in conjunction with the current limiters to provide the desired current and voltage conditions for each polarity.

Figure 5:
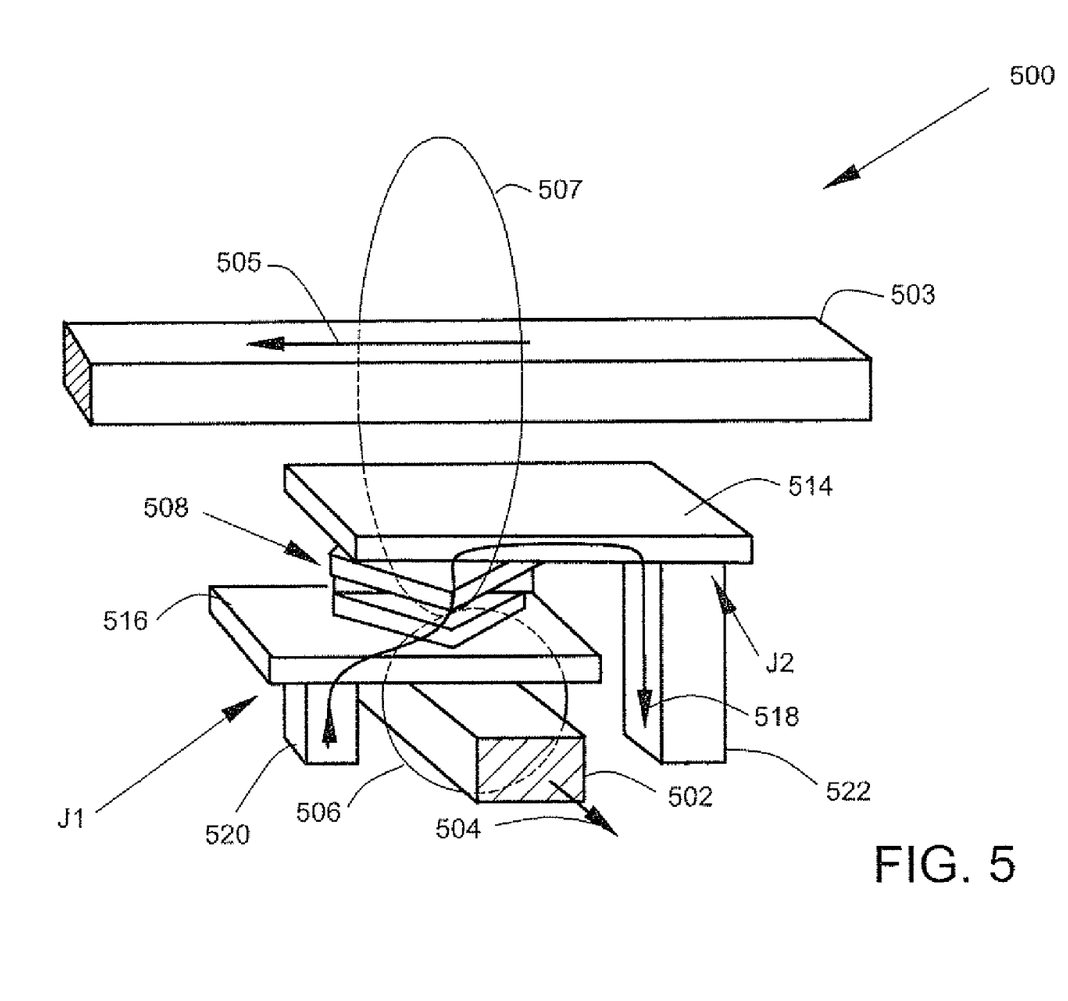
FIG. 5 illustrates aspects of a MRAM memory element that includes a thermoelectric device that is pulsed.

FIG. 5 illustrates aspects of a MRAM memory element 500 that includes a thermoelectric device that is pulsed. The memory element 500 comprises write conductors 502, 503. The write conductor 502 carries a write current 504 during a write time interval. The write conductor 503 carries a write current 505 during the write interval. The write current 504 generates a magnetic field 506. The write current 505 generates a magnetic field 507. The magnetic fields 506, 507 passes through a magnetoresistive sensor 508. An insulation layer (not illustrated in FIG. 5) separates a contact layer 514 from the write conductor 503. The memory element 500 includes sense contact layers 514, 516 that contact the magnetoresistive sensor 508. The writing can either be via a magnetic field created by the current (as illustrated) or it can be due to spin momentum transfer from the write current (not illustrated). During a read interval, a sense current 518 flows through the contact layer 514, the magnetoresistive sensor 508 and the contact layer 516. During a write interval, a write potential is applied to the magnetoresistive sensor 508 by the contact layers 514, 516. Contact layers 514 and 516 or, alternatively, write conductors 502 and 503 can be used to apply the potential. Contact layers 514 and 516 can also be used to write the bit via spin momentum transfer. Spin momentum transfer could be used if a current is flowing through the free layer of the memory device.

The contact layer 516 contacts a leg 520 to form a first thermoelectric junction J1. In one aspect, the leg 520 comprises a P-type semiconductor thermoelectric material. The contact layer 514 contacts a leg 522 to form a second thermoelectric junction J2. In another aspect, the leg 522 comprises an N-type semiconductor thermoelectric material. The junctions J1 and J2 are interconnected via a current path through the magnetoresistive sensor 508 to form a thermoelectric device. A first polarity of current 518 is pulsed to provide pulsed cooling at junction J1. A second polarity of current 518 is pulsed to provide pulsed heating at junction J1. The magnetoresistive sensor 508 includes a layer with a magnetic material property that is altered by the heat flow from the thermoelectric device.

The sense current leads in FIG. 5 comprise thermoelectric materials as shown. By applying an electrical current through the sense current leads, the Magnetic Tunneling Junction (MTJ) can be heated or cooled.

Figure 6:
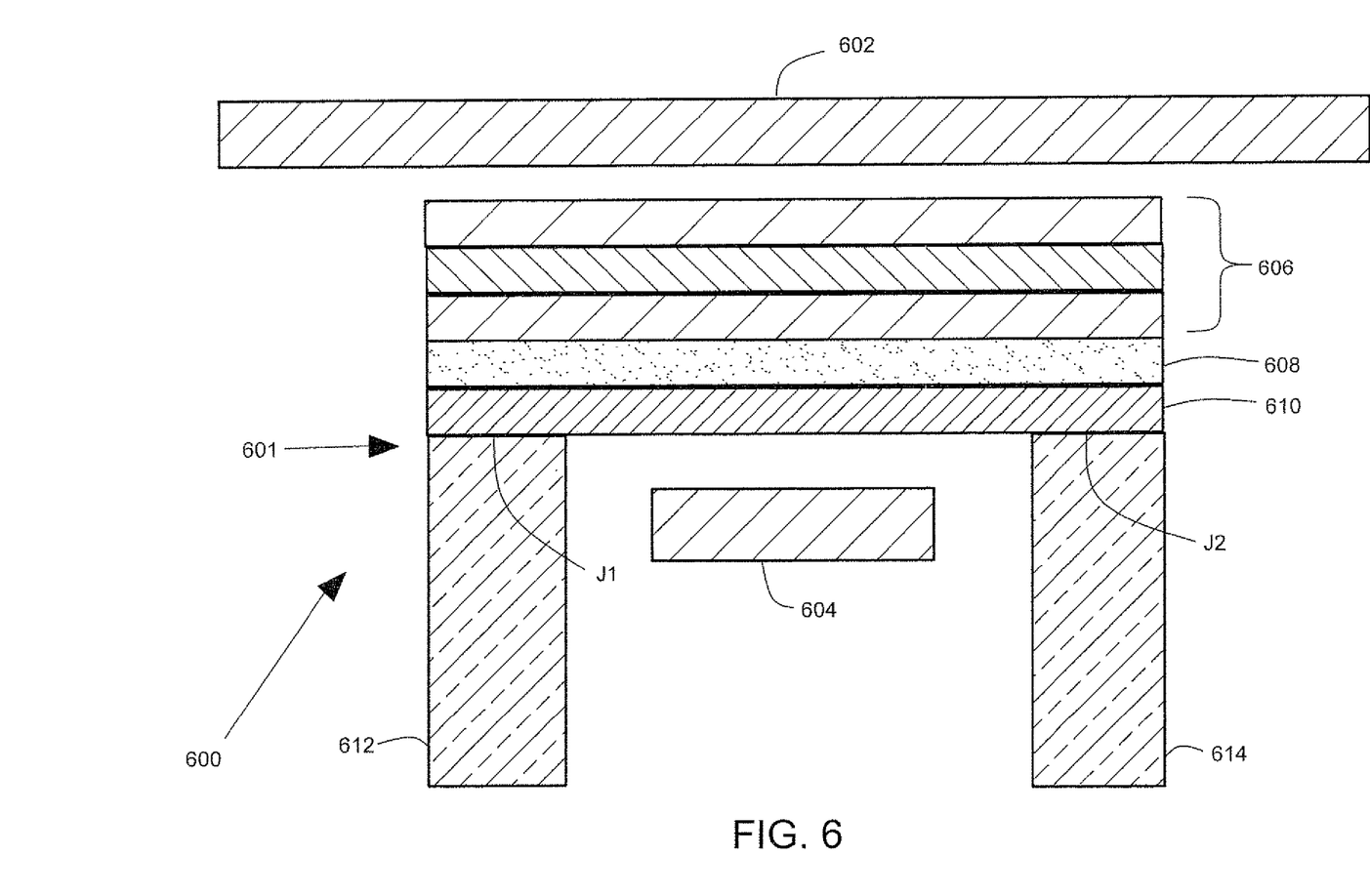
FIG. 6 illustrates aspects of a memory element that includes a thermoelectric device that is pulsed.

To avoid joule heating during the cooling process, it is not desired to have current flowing through the MTJ junction, and the structure in FIG. 6 can be used.

FIG. 6 illustrates aspects of a memory element 600 that includes a thermoelectric device 601 that is pulsed. The memory element 600 comprises write conductors 602, 604 that produce a magnetic field in a magnetic tunnel junction 606. The magnetic tunnel junction comprises a memory cell. An electrically insulating and thermally conducting layer 608 separates the thermoelectric device 601 from the magnetic tunnel junction 606.

The writing can either be via a magnetic field created by the current (as illustrated) or it can be due to spin momentum transfer from the write current (not illustrated). During a read interval, a sense current flows through the magnetic tunnel junction 606. During a write interval, a write potential is applied to the magnetic tunnel junction 606.

An electrical conducting layer 610 contacts a leg 612 to form a first thermoelectric junction J1. In one aspect, the leg 612 comprises a P-type semiconductor thermoelectric material. The electrical conducting layer 610 contacts a leg 614 to form a second thermoelectric junction J2. In another aspect, the leg 614 comprises an N-type semiconductor thermoelectric material. The junctions J1 and J2 are interconnected via a current path through the electrical conducting layer 610 to form a thermoelectric device. A first polarity of current is pulsed to provide pulsed cooling at junctions J1 and J2. Alternatively or additionally, a second polarity of current is pulsed to provide pulsed heating at junctions J1 and J2. The tunnel junction 606 includes a layer with a magnetic material property that is altered by the heat flow from the thermoelectric device 601.

Figure 7A:
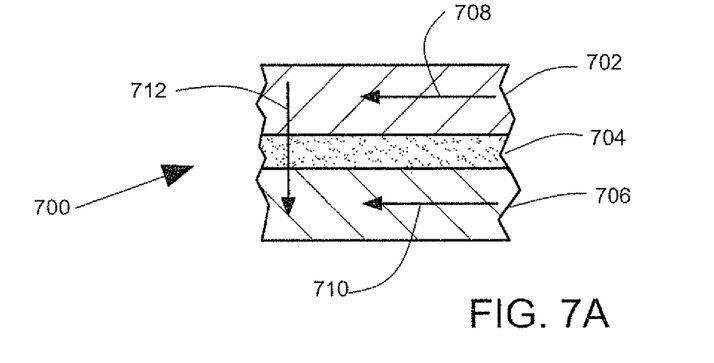
FIG. 7A illustrates a cross-sectional view of a portion of a magnetic tunnel junction.

FIG. 7A illustrates a cross-sectional view of a portion of a magnetic tunnel junction 700. The magnetic tunnel junction 700 comprises a free layer 702, a barrier layer 704 and a fixed layer 706. A direction of magnetization in the free layer is indicated by arrow 708. A direction of magnetization in the fixed layer is indicated by arrow 710. A direction of read current flow is indicated by arrow 712. The free layer 702 and the fixed layer 706 are formed of materials that have magnetic material properties that vary with temperature. In one aspect, the magnetic material property that varies with temperature is magnetic coercive force Hc as described in more detail below in connection with FIG. 7B.

Figure 7B:
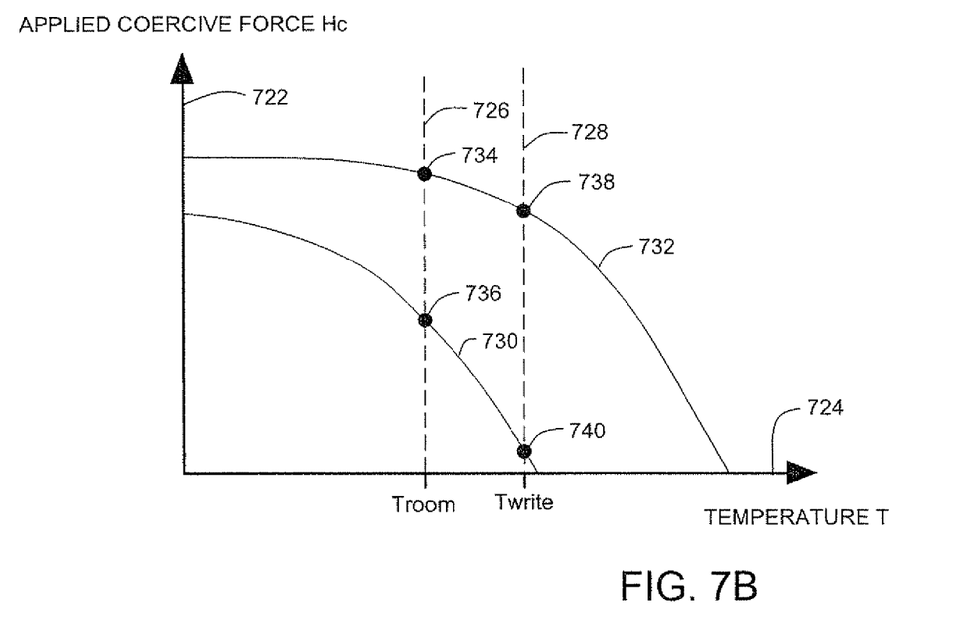
FIG. 7B illustrates a graph of coercive force Hc as a function of temperature.

FIG. 7B illustrates a graph of coercive force Hc as a function of temperature. A vertical axis 722 represents coercive force Hc. A horizontal axis 724 represents a temperature of the tunnel junction 700. A vertical line 726 represents "room temperature", or in other words a temperature of the magnetic tunnel junction 700 when there is no heating or cooling from a thermoelectric device. A vertical line 728 represents "write temperature," or in other words a temperature to which the magnetic tunnel junction 700 is heated by a thermoelectric device.

A first characteristic curve 730 represents the coercive force of the free layer 702 as a function of temperature. A second characteristic curve 732 represents the coercive force of the fixed layer as a function of temperature. It can be seen by inspection of FIG. 7B that, at the room temperature 726, both the free layer 702 and the fixed layer 706 have significant coercive forces at points 734 and 736 and are therefore nonvolatile with respect to stray magnetic fields from adjacent cells and with respect to read fields. It can be seen by inspection of FIG. 7B that, at the write temperature 728, the fixed layer 706 has significant coercive force at point 738, and the free layer has low coercive force at point 740. The free layer 702 has low coercive force at write temperature 728 and can be easily rotated to write data.

If the magnetic properties of the free layer and fixed layers are chosen as shown in the FIGS. 7A-7B, by heating the cell to the temperature Twrite, before writing the cell, only a small field is needed to write. After writing, the cell is cooled to room temperature naturally or by the thermoelectric device, and the cell is very stable. This reduces the power needed to write, and reduces cross-talk problem for the neighboring bits, and the bit density can be increased. When reading a bit the bit can be cooled at lower temperature to reduce thermal noise and increase signal to noise ratio (SNR).

Figure 8:
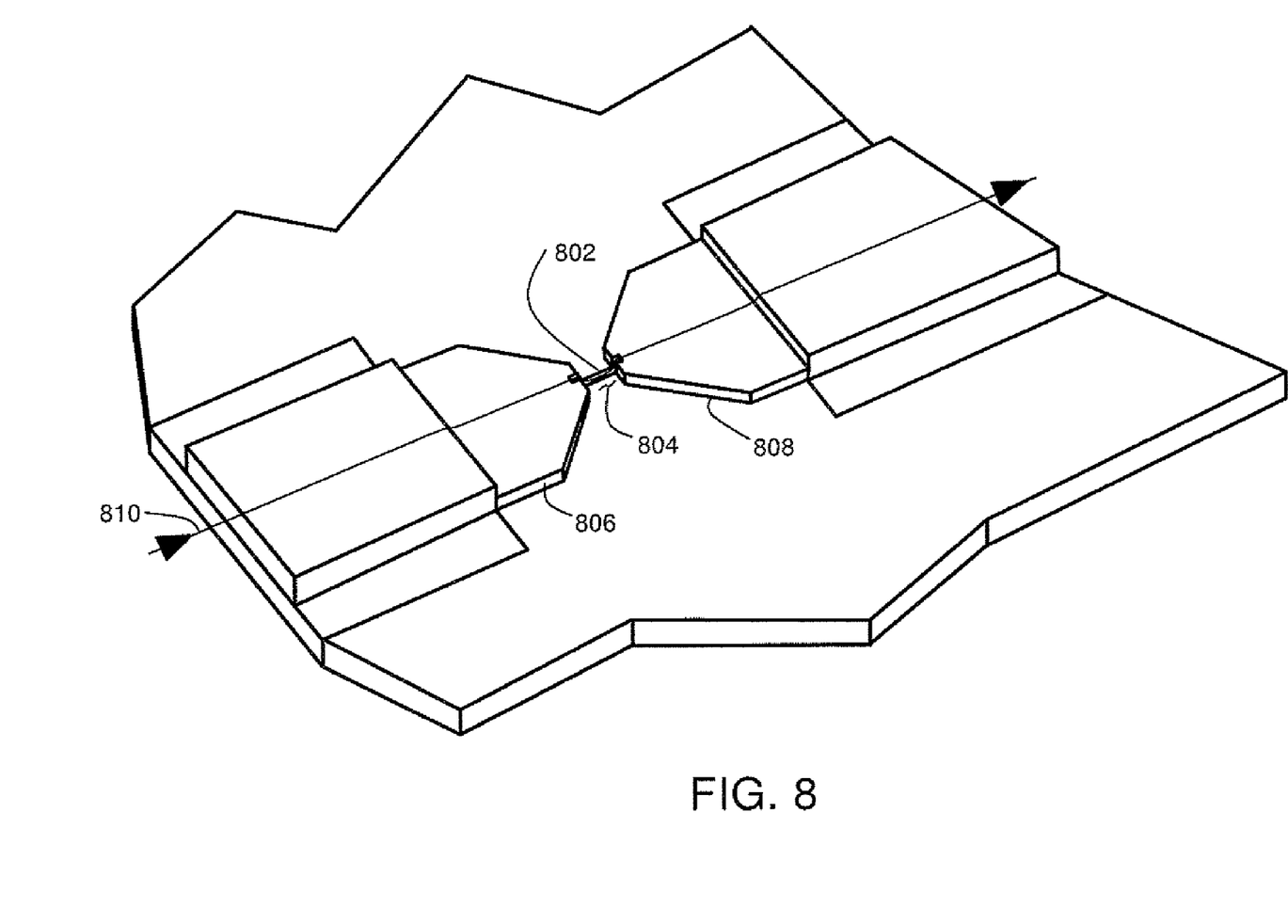
FIG. 8 illustrates a memory element that comprises phase change material.

FIG. 8 illustrates a memory element 800. The memory element 800 comprises a memory cell 802. The memory cell 802 comprises phase change material. Phase change material is known from use in optical storage media. Phase change materials change their material properties depending on whether they are in their amorphous or crystalline phase.

An electric current pulse 810 passes the memory cell 802. A substrate 804 acts as a heat sink to cool the memory cell 802 after the heating pulse.

Current leads 806, 808 comprise thermoelectric materials. In one aspect, the current lead 806 comprises a P-type semiconductor material and the current lead 808 comprises an N-type semiconductor material. The current pulse 810 provides both Joule heating and thermoelectric heating to a selected portion of the memory element 800, increasing the heating efficiency for the selected region. When thermoelectric cooling is desired, the polarity of the current pulse 810 is reversed. This way, both heating and cooling can be achieved by applying an electric current through the thermoelectric couple. In one aspect, high efficiency thermoelectric materials are used, and the heating is more efficient than just joule heating, and the cooling is much better than use of the heat sink 804 alone. The power necessary to operate the memory cell 800 is reduced.

Figure 9:
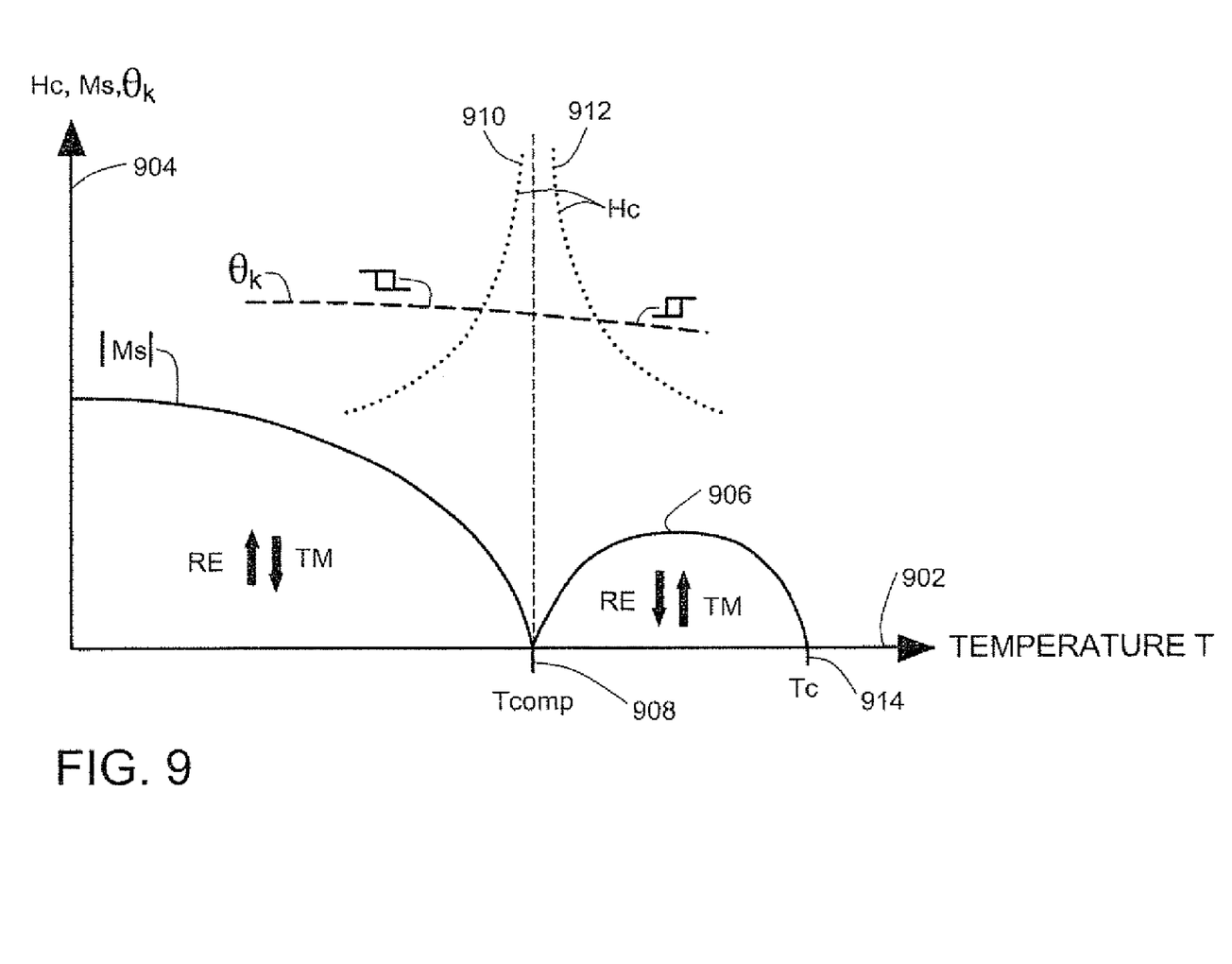
FIG. 9 illustrates a graph of properties of a rare earth-transition metal alloy as a function of temperature.

FIG. 9 illustrates a graph of properties of a rare earth-transition metal alloy as a function of temperature. A horizontal axis 902 represents temperature T. A vertical axis 904 represents, alternatively, coercivity Hc, net magnetization Ms, and Kerr rotation θk. A direction of Kerr rotation changes, as illustrated, at a temperature Tcomp and the directions of Kerr rotation is indicated by the symbols ⊓ and ⊔.

Rare Earth-Transition Metal (RE-TM) alloys, such as TbFeCo can also be used as a memory cell (such as cell 123 in FIG. 1 or cell 214 in FIG. 2). RE-TM alloys have an antiferromagnetic coupling between the RE and the TM components. The net magnetization Ms (illustrated as solid line 906) can be small in spite of the fact that the magnetizations of the RE and TM subnetworks are high. As the temperature dependencies of the two subnetwork magnetizations are different, often a compensation temperature (Tcomp at 908) exists where the net magnetization is even zero, as illustrated in FIG. 9. At this compensation temperature Tcomp, the coercivity Hc (illustrated as dotted lines 910, 912) of the material approaches infinity because an external field can not turn the magnetization into any given direction. This is important for the stability of the domains. At a high temperature near the Curie temperature (Tc at 914), the coercivity Hc is sufficiently small to form a domain by the external bias field Hb. During cooling to room temperature, the coercivity Hc increases rapidly and, as a consequence, a written domain will not be disturbed by any external stray field.

Therefore, by using the thermoelectric device together with the RE-TM alloy which has a Tcomp around room temperature (RT), such as alloy $Tb_{27.2}Fe_{65.5}Co_{7.5}$ (FIG. 10), data can be stored the data in the RE-TM, and data can be written to it either above RT or below RT where the coercivity is small, and then data is stored at or near room temperature RT.

Figure 10:
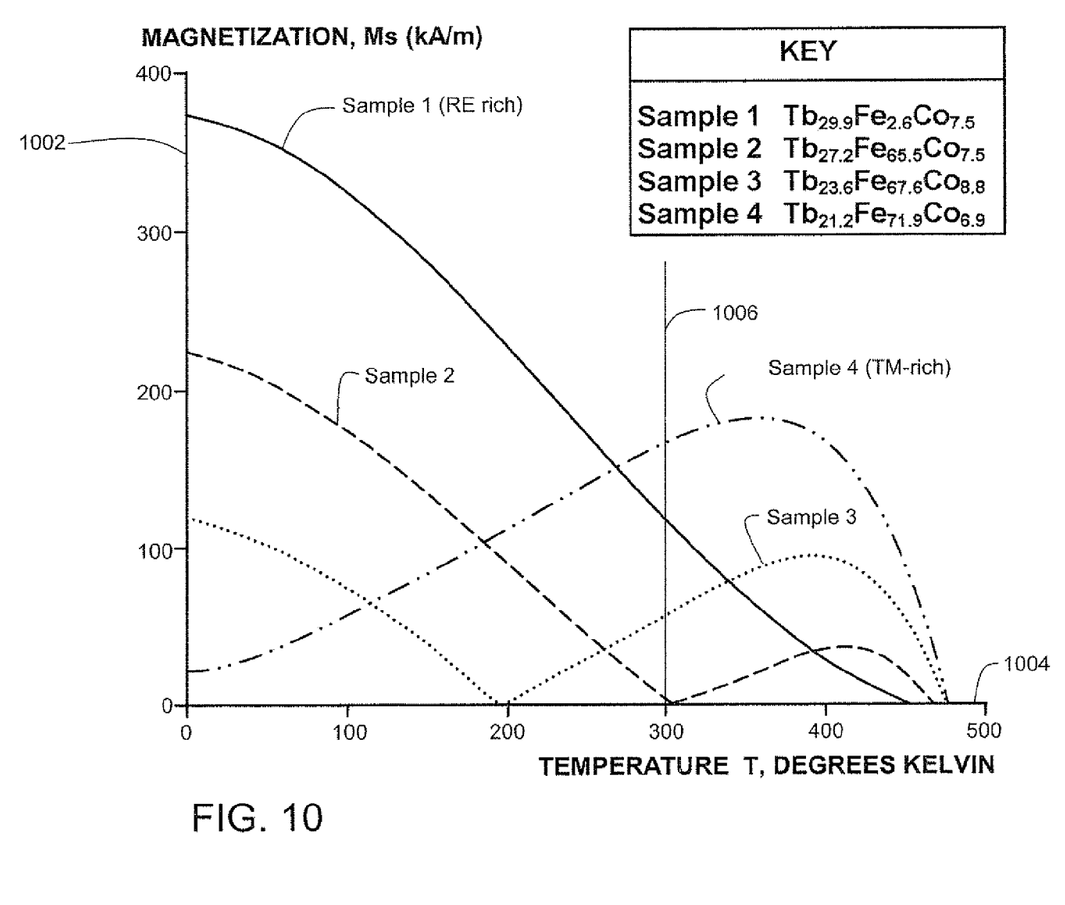
FIG. 10 illustrates magnetization Ms as a function of temperature for four samples of TbFeCo thin films with different compositions.

FIG. 10 illustrates magnetization Ms as a function of temperature for four samples of TbFeCo films with different compositions indicated by the key in FIG. 10. A vertical axis 1002 represents magnetization Ms in kA/m. a horizontal axis 1004 represents temperature in degrees Kelvin. A dashed vertical line 1006 indicates room temperature. It can be seen from inspection of FIG. 10 that the composition of the TbFeCo alloy can be adjusted to obtain a Tcomp near room temperature.

By selection of materials, there are many combinations of storage layer material and heating and cooling timing that can be used. For example, the cooling and heating by the thermoelectric device can induce large thermal stress in some materials which have high coefficient of thermal expansion (CTE). The high CTE material is put in contact with a free layer (FL) and the free layer has a large magnetostriction, the heating/cooling reduces the anisotropy in the FL and allow for low powers for writing.

The free layer (FL) of a MTJ can be separated from a permanent magnet (PM) by an interlayer. The interlayer can then be chosen such that the coupling between the PM and MTJ free layer can be either ferromagnetic (FM) or antiferromagnetic (AFM) depending on the temperature and zero at room temperature. The FL magnetization can then set by changing the temperature. The FL isn't completely free. It is free in the same sense as in an MRAM device. One possible interlayer is a RE-TM alloy. Alternatively the spacer can have a CTE such that the temperature can cause the coupling (RKKY) through the interlayer to change from AFM to zero to FM as the temperature is increased/decreased and the lattice expands.

Another option to switch the FL is to have a RE high magnetic moment material adjacent to the thermoelectric device. These materials have Curie temperature larger than RT but have very high moment when cooled below RT. When both the write line (adjacent to the RE materials) and the thermoelectric cooling lines are activated, the RE material has a well defined magnetization orientation and will generate a high enough field to switch the FL in an adjacent MTJ. This reduces the powers for the writing.

In the aspects described above, thermoelectric devices provide thermal management of memory cells. A pulse of electric power is applied to a thermoelectric device to generate a transient temperature gradient in the thermoelectric device. The temperature gradient is advantageously used for cooling or heating some portion or all of a selected memory cell. The cooling or heating pulse provides a pulse change of a material property of at least a portion of the memory cell.

Thermoelectric devices contain thermoelectric materials which provide thermoelectric properties. Of particular interest for use with memory cells are patterned thin films of thermoelectric materials. Such thin films have the advantage of convenient integration into electronic and semiconductor devices. For example, thin film thermoelectric devices provide steady state cooling for regulating the temperature of microelectronic processors and for conducting thermochemistry experiments on the microscale level.

In the aspects described above, thermoelectric materials are applied to memory cells in storage devices. In one aspect, thermoelectric assisted nonvolatile memory devices are disclosed. In those memory devices, one or more thermal elements are used to assist the write/read process of the memory cell. The application of the thermoelectric devices helps to reduce power consumption and increase the array density of the nonvolatile memory devices. High thermoelectric efficiency enhances these advantages. High efficiency thermoelectric materials can be fabricated in the thin film form on the large size wafer in the mass production. In another aspect, the thermoelectric devices are patterned at a nanoscale size to match the nanoscale size of the memory array. Thermoelectric performance improves at the nanoscale size according to theoretical predictions.

It is to be understood that even though numerous characteristics and advantages of various aspects of the invention have been set forth in the foregoing description, together with details of the structure and function of various aspects of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the memory element while maintaining substantially the same functionality without departing from the scope and spirit of the present invention.

What is claimed is:

1. A memory element, comprising:
   a memory cell that is addressable;
   a thermoelectric device thermally coupled to the memory cell; and
   electrical conductors providing a cooling current pulse to the thermoelectric device during a read time interval such that a portion of the memory cell is cooled below a read temperature threshold during application of a read pulse to the memory cell.

2. The memory element of claim 1 wherein the thermoelectric device comprises semiconductor thermoelectric material.

3. The memory element of claim 1 wherein the memory cell comprises a layer of material having a material property that changes with temperature.

4. The memory element of claim 1 wherein the memory cell comprises a magnetic tunneling junction.

5. The memory element of claim 1 wherein the memory cell comprises phase change material.

6. The memory element of claim 1 wherein the memory cell comprises a rare earth transition metal alloy.

7. The memory element of claim 1 wherein the cooling current pulse has a pulse width in the range of 10 nanoseconds to 100 microseconds.

8. The memory element of claim 1 comprising vias that address the memory for reading and writing.

9. The memory element of claim 1 comprising a thermally conducting, electrically insulating layer between the memory cell and the thermoelectric device.

10. A memory array, comprising:
    an array of addressable memory cells;
    an array of thermoelectric devices, each thermoelectric device being thermally coupled to one memory cell in the array of memory cells; and
    a grid of electrical conductors that selectively addresses one of the thermoelectric devices with a cooling current pulse during a read time interval such that a portion of a selectively addressed memory cell is cooled below a read temperature threshold during application of a read pulse to the selectively addressed memory cell.

11. The memory array of claim 10 wherein the thermoelectric device comprises semiconductor thermoelectric material.

12. The memory array of claim 10 wherein the memory cell comprises a layer of material having a material property that changes with temperature.

13. The memory array of claim 10 wherein the memory cell comprises a magnetic tunneling junction.

14. The memory array of claim 10 wherein the memory cell comprises phase change material.

15. The memory array of claim 10 wherein the memory cell comprises a rare earth transition metal alloy.

16. The memory array of claim 10 wherein the cooling current pulse has a pulse width in the range of 10 nanoseconds to 100 microseconds.

17. The memory array of claim 10 comprising vias that address the memory for reading and writing.

18. The memory array of claim 10 comprising a thermally conducting, electrically insulating layer between each memory cell and each thermoelectric device.

19. A method of data storage, comprising:
    addressing a memory cell to access data;
    addressing a thermoelectric device that is thermally coupled to the memory cell; and
    providing a cooling current pulse to the thermoelectric device during a read time interval such that a portion of the addressed memory cell is cooled below a read temperature threshold during application of a read pulse to the addressed memory cell.

20. The method of claim 19 and forming the thermoelectric device from semiconductor thermoelectric material.

21. The method of claim 19 and depositing a layer in the memory cell that has a material property that changes with temperature.

22. The method of claim 19 and controlling the cooling current pulse to have a pulse width in the range of 10 nanoseconds to 100 microseconds.

23. The method of claim 19 wherein the thermoelectric device comprises first and second junctions, and the method further comprising:

thermally coupling the first and second junctions to the memory cell.

24. The method of claim 19 and forming the memory cell to include a magnetic tunneling junction.

\* \* \* \* \*